US012500121B2

(12) United States Patent
Komatsu

(10) Patent No.: US 12,500,121 B2
(45) Date of Patent: Dec. 16, 2025

(54) METHOD FOR FORMING WIRING ON SEMICONDUCTOR DEVICE

(71) Applicant: CONNECTEC JAPAN Corporation, Myoko (JP)

(72) Inventor: Hiroshi Komatsu, Myoko (JP)

(73) Assignee: CONNECTEC JAPAN CORPORATION, Myoko (JP)

( * ) Notice: Subject to any disclaimer, the term of this patent is extended or adjusted under 35 U.S.C. 154(b) by 603 days.

(21) Appl. No.: 17/791,258

(22) PCT Filed: Sep. 18, 2020

(86) PCT No.: PCT/JP2020/035464
§ 371 (c)(1),
(2) Date: Jul. 7, 2022

(87) PCT Pub. No.: WO2021/140709
PCT Pub. Date: Jul. 15, 2021

(65) Prior Publication Data
US 2023/0352341 A1    Nov. 2, 2023

(30) Foreign Application Priority Data
Jan. 8, 2020   (JP) ................................. 2020-001348

(51) Int. Cl.
*H01L 21/768*      (2006.01)
(52) U.S. Cl.
CPC ............................ *H01L 21/76885* (2013.01)
(58) Field of Classification Search
CPC ............ H01L 21/76885; H05K 3/1275; H05K 3/207; H05K 2203/0338
See application file for complete search history.

(56) References Cited

U.S. PATENT DOCUMENTS

| 5,127,330 A | 7/1992 | Okazaki et al. |
| 6,051,448 A | 4/2000 | Hayama et al. |

(Continued)

FOREIGN PATENT DOCUMENTS

| EP | 0 402 942 A2 | 12/1990 |
| JP | 11-154782 A | 6/1999 |

(Continued)

OTHER PUBLICATIONS

Office Action issued Mar. 22, 2024 in Korean Application No. 10-2022-7020303.

(Continued)

*Primary Examiner* — David A Zarneke
(74) *Attorney, Agent, or Firm* — Sughrue Mion, PLLC

(57) ABSTRACT

A method for forming electroconductive elements into a pattern on a substrate, in which: recesses (3) in a printing plate (2) are filled with an electroconductive paste (4) containing a resin that is curable by active light rays, the active-light-curable-resin-containing electroconductive paste (4) including an active-light-curable resin for which the average particle diameter is set to 0.1-20 μm; the printing plate (2) is superposed on a substrate (1); at least a contact interface portion at which the active-light-curable-resin-containing electroconductive paste (4) contacts the recesses (3) is cured by being irradiated with active light rays from the printing plate (2) side; and then the printing plate (2) is separated from the substrate (1), the active-light-curable-resin-containing electroconductive paste (4) is transferred to the substrate (1), and electroconductive elements (5) having a prescribed pattern are formed on the substrate (1).

5 Claims, 3 Drawing Sheets

(56) References Cited

U.S. PATENT DOCUMENTS

2004/0110321 A1 6/2004 Oda et al.
2010/0052995 A1 3/2010 Lee et al.

FOREIGN PATENT DOCUMENTS

| JP | 2003-298214 A | | 10/2003 |
|---|---|---|---|
| JP | 2003283105 A | * | 10/2003 |
| JP | 2008-179034 A | | 8/2008 |
| JP | 2015-41742 A | | 3/2015 |
| JP | 2016-058664 A | | 4/2016 |
| KR | 10-2019-0077547 A | | 7/2019 |
| WO | 2018/105353 A1 | | 6/2018 |

OTHER PUBLICATIONS

International Search Report of PCT/JP2020/035464 dated Dec. 8, 2020 [PCT/ISA/210].
Extended European Search Report issued Jan. 24, 2024 in European Application No. 20911319.0.
Communication dated Jan. 24, 2025 issued by the State Intellectual Property Office of the P.R. China in application No. 202080084628.8.
Communication issued Jul. 10, 2025 in Chinese Application No. 202080084628.8.

* cited by examiner

ACTIVE LIGHT RAYS (ULTRAVIOLET LIGHT RAYS)

ACTIVE LIGHT RAYS (ULTRAVIOLET LIGHT RAYS)

METHOD FOR FORMING WIRING ON SEMICONDUCTOR DEVICE

CROSS REFERENCE TO RELATED APPLICATIONS

This application is a National Stage of International Application No. PCT/JP2020/035464 filed on Sep. 18, 2020, claiming priority based on Japanese Patent Application No. 2020-001348 filed on Jan. 8, 2020.

TECHNICAL FIELD

The present invention relates to a method for forming electroconductive elements into a pattern on a substrate.

BACKGROUND ART

Semiconductor chips are proceeding to decrease in size as chip wiring rules allow for increases in fineness. However, in substrates on which chips are mounted (i.e., semiconductor package substrates), it has become difficult to reduce the substrate surface area using the same proportions as those for the chip size because limitations are imposed in regard to increasing the fineness of bump pitch.

In view of the foregoing, the applicant furthered the development of a feature for reducing the pitch of substrate wiring using grayscale lithography and imprinting techniques, and proposed the method for manufacturing a substrate having electroconductive elements that is disclosed in Japanese Laid-open Patent Application No. 2016-58664 (referred to below as a prior-art example).

In the prior-art example: recesses provided to a printing plate are filled with an electroconductive paste, the recesses being formed in the same pattern as a wiring pattern to be formed on a substrate; and the printing plate, in which the recesses are filled with the electroconductive paste, is superposed and pressure-bonded onto the substrate, whereby the electroconductive paste with which the recesses in the printing plate are filled is transferred to the substrate, and wiring having a prescribed pattern is formed on the substrate.

PRIOR ART DOCUMENTS

Patent Documents

[Patent Document 1] Japanese Laid-open Patent Application No. 2016-58664

DISCLOSURE OF THE INVENTION

Problem the Invention is Intended to Solve

In the prior-art example described above, the applicant used a thermoset-resin-containing electroconductive paste in which a thermoset resin was incorporated into an electroconductive paste. When the electroconductive paste with which the recesses in the printing plate are filled is transferred to the substrate, the resin in sites where the electroconductive paste contacts the printing plate is cured through a heat treatment, so that the release properties of the electroconductive paste relative to the printing plate are improved.

However, in the prior-art example, although using thermoset-resin-containing electroconductive paste improves the release properties, other problems may arise; i.e., thermal expansion or thermal shrinkage may occur due to the heat treatment, the pattern may deform as a consequence thereof or stress may arise between the electroconductive paste and the printing plate due to the pattern deforming, there will be a greater likelihood of incomplete transferring due to the resulting stress, and it will be necessary to maintain a heated state for a given time in the heat treatment, increasing the processing time and reducing throughput.

The present invention was contrived in view of such circumstances, it being an object of the present invention to provide an exceptionally practical method for forming electroconductive elements into a pattern on a substrate, the method being such that pattern deformation occurring during curing of an electroconductive paste is suppressed when a prescribed wiring pattern is formed by transfer on a substrate, complete transfer of the electroconductive paste can be realized, a curing process can be performed in a short time, and throughput is improved.

Means for Solving the Problem

The main points of the present invention are described below with reference to the accompanying drawings.

The present invention relates to a method for forming electroconductive elements into a pattern on a substrate, the method being characterized by having: a step for filling recesses 3 that are formed in a printing plate 2 and that exhibit a prescribed pattern with an electroconductive paste 4 containing a resin that is curable by active light rays, the active-light-curable-resin-containing electroconductive paste 4 being obtained by incorporating an active-light-curable resin into an electroconductive paste for which the average particle diameter of an electroconductive material is set to 0.1-20 μm; a step for superposing the printing plate 2 filled with the active-light-curable-resin-containing electroconductive paste 4 onto a substrate 1; a step for irradiating the active-light-curable-resin-containing electroconductive paste 4, with which the recesses 3 in the printing plate 2 are filled, with active light rays and curing the active-light-curable-resin-containing electroconductive paste 4; and a step for separating the printing plate 2 from the substrate 1, transferring the active-light-curable-resin-containing electroconductive paste 4 to the substrate 1, and forming electroconductive elements 5 having the prescribed pattern on the substrate 1.

The present invention also relates to the method for forming electroconductive elements into a pattern on a substrate according to the first aspect, the method being characterized in that the active-light-curable-resin-containing electroconductive paste 4 is irradiated with the active light rays from the bottom side of the recesses 3 in the printing plate 2 during curing.

The present invention also relates to the method for forming electroconductive elements into a pattern on a substrate according to the first aspect, the method being characterized in that the volumetric content ratio for the active-light-curable resin in the active-light-curable-resin-containing electroconductive paste 4 is 70% or less.

The present invention also relates to the method for forming electroconductive elements into a pattern on a substrate according to the second aspect, the method being characterized in that the volumetric content ratio for the active-light-curable resin in the active-light-curable-resin-containing electroconductive paste 4 is 70% or less.

The present invention also relates to the method for forming electroconductive elements into a pattern on a substrate according to any of the first to fourth aspects, the method being characterized in that an intermediate layer 6 that deforms under application of pressure is provided to the substrate 1, the printing plate 2 filled with the active-light-curable-resin-containing electroconductive paste 4 is superposed on the intermediate layer 6, and the active-light-curable-resin-containing electroconductive paste 4 is transferred to the substrate 1 with the intermediate layer 6 interposed therebetween.

The present invention also relates to the method for forming electroconductive elements into a pattern on a substrate according to the fifth aspect, the method being characterized in that the intermediate layer 6 is formed from an active-light-curable resin or a thermoset resin.

The present invention also relates to the method for forming electroconductive elements into a pattern on a substrate according to any of the first to fourth aspects, the method being characterized in that the active-light-curable resin is an ultraviolet-ray-curable resin that is cured by being irradiated with ultraviolet rays.

The present invention also relates to the method for forming electroconductive elements into a pattern on a substrate according to the fifth aspect, the method being characterized in that the active-light-curable resin is an ultraviolet-ray-curable resin that is cured by being irradiated with ultraviolet rays.

The present invention also relates to the method for forming electroconductive elements into a pattern on a substrate according to the sixth aspect, the method being characterized in that the active-light-curable resin is an ultraviolet-ray-curable resin that is cured by being irradiated with ultraviolet rays.

Effect of the Invention

Due to being configured as described above, the present invention provides an unprecedented and innovative method for forming electroconductive elements into a pattern on a substrate, the method being such that pattern deformation occurring during curing of an electroconductive paste is suppressed when a prescribed wiring pattern is formed by transfer on a substrate, complete transfer of the electroconductive paste can be realized, and furthermore, curing advances in a short time (instantaneously) provided that an active-light-curable resin is irradiated with active light rays required for the effect, therefore making it possible to shorten the time required for a curing process and to improve throughput. Moreover, in the method according to the present invention, because there is used an active-light-curable-resin-containing electroconductive paste obtained by incorporating an active-light-curable resin into an electroconductive paste for which the average particle diameter of an electroconductive material is set to 0.1-20 μm, the wiring pattern formed by transfer on the substrate becomes smoother (assumes a smooth form having few recesses and protrusions), whereby localized concentration of electrical fields between wirings is mitigated and the long-term reliability of the wirings is improved.

BEST MODE FOR CARRYING OUT THE INVENTION

Figure 1:
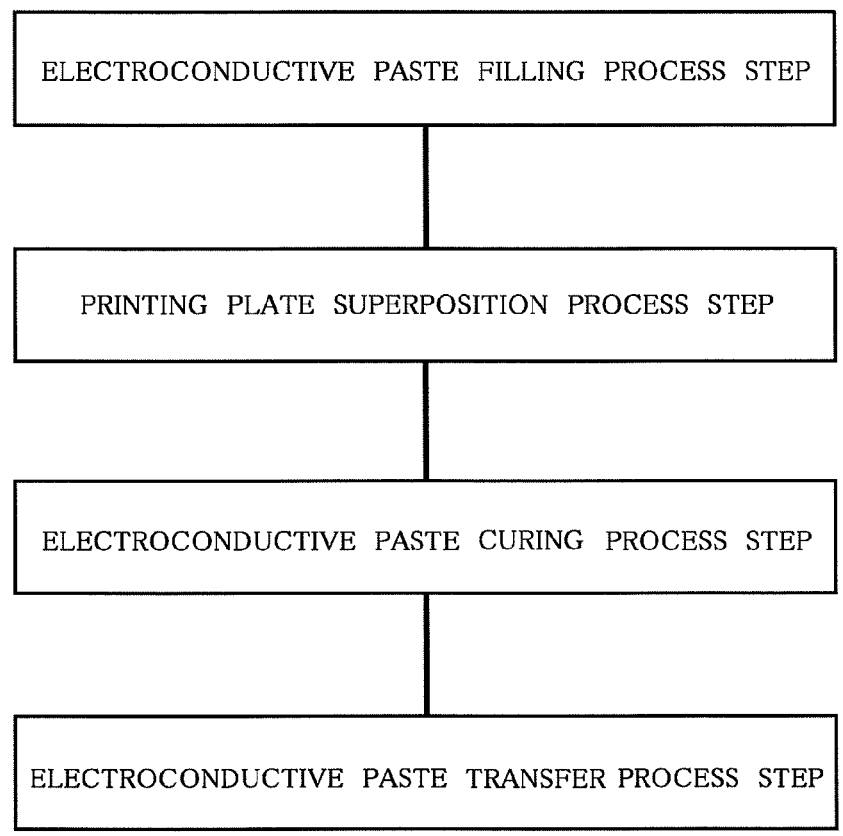
FIG. 1 is a step flow chart of the present example.

Preferred embodiments of the present invention are briefly described below with reference to the diagrams while indicating the effects of the present invention.

Recesses 3 formed in a printing plate 2 are filled with an electroconductive paste 4 containing a resin that is curable by active light rays, the printing plate 2 filled with the active-light-curable-resin-containing electroconductive paste 4 is superposed on a substrate 1 (or the substrate 1 may be superposed on the printing plate 2), and, for example, at least a contact interface portion at which the active-light-curable-resin-containing electroconductive paste 4 with which the recesses 3 are filled contacts the recesses 3 is cured by being irradiated with active light rays from the printing plate 2 side, after which the printing plate 2 is separated from the substrate 1.

The active-light-curable-resin-containing electroconductive paste 4, with which the recesses 3 in the printing plate 2 are filled, is thereby transferred to the substrate 1, and electroconductive elements 5 having a prescribed pattern are formed on the substrate 1. The printing plate 2 may be superposed on the substrate 1 after at least the contact interface portion at which the active-light-curable-resin-containing electroconductive paste 4 with which the recesses 3 are filled contacts the recesses 3 is cured by being irradiated with active light rays in advance.

In the present invention, as described above, the active-light-curable-resin-containing electroconductive paste 4 is used as an electroconductive paste for forming the electroconductive elements 5, and the active-light-curable-resin-containing electroconductive paste 4 is cured by being irradiated with active light rays. Therefore, the release properties of the active-light-curable-resin-containing electroconductive paste 4 with respect to the printing plate 2 are improved, the occurrence of defects such as pattern deformation or incomplete transfer occurring upon curing with heat is prevented, and furthermore, the time required for a curing process is shorter than is the case when curing with heat (i.e., curing advances instantaneously) and throughput is also improved.

Moreover, in the present invention, because the electroconductive elements 5 are formed from the active-light-curable-resin-containing electroconductive paste 4, which is obtained by incorporating an active-light-curable resin into an electroconductive paste for which the average particle diameter of an electroconductive material is set to 0.1-20 μm, the electroconductive elements 5 formed on the substrate 1 becomes smoother (assumes a smooth form having few recesses and protrusions), whereby localized concentration of electrical fields between wirings is mitigated and the long-term reliability of the wirings is improved.

Thus, the present invention relates to an unprecedented and innovative method for forming electroconductive elements into a pattern on a substrate.

Examples

A specific example of the present invention is described below with reference to the drawings.

The present example relates to a method for manufacturing a semiconductor device (method for forming wiring in a semiconductor device).

Specifically, the present invention relates to a method for forming electroconductive elements 5 (wiring) having a prescribed pattern on a substrate 1 using an imprinting technique, the method having: a step (electroconductive paste filling process step) for filling recesses 3 that are formed in a printing plate 2 and that exhibit a prescribed pattern with an electroconductive paste 4 containing a resin that is curable by active light rays, the active-light-curable-resin-containing electroconductive paste 4 being obtained by incorporating an active-light-curable resin into an electroconductive paste for which the average particle diameter of an electroconductive material is set to 0.1-20 μm; a step (printing plate superposition process step) for superposing the printing plate 2 filled with the active-light-curable-resin-containing electroconductive paste 4 onto the substrate 1; a step (electroconductive paste curing process step) for irradiating the active-light-curable-resin-containing electroconductive paste 4, with which the recesses 3 in the printing plate 2 are filled, with active light rays and curing the active-light-curable-resin-containing electroconductive paste 4; and a step (electroconductive paste transfer process step) for separating the printing plate 2 from the substrate 1, transferring the active-light-curable-resin-containing electroconductive paste 4 to the substrate 1, and forming the electroconductive elements 5 having the prescribed pattern on the substrate 1.

First to be described are, inter alia, the members that are used in the present example.

In the substrate 1, an intermediate layer 6 is provided to an electroconductive element formation surface at which the electroconductive elements 5 are to be formed. The intermediate layer 6 is used for bringing the active-light-curable-resin-containing electroconductive paste 4 uniformly into contact with the electroconductive element formation surface of the substrate 1. The intermediate layer 6 is formed from an adhesive material that deforms under application of pressure, specifically an active-light-curable resin or a thermoset resin, and is provided at least to a position at which the electroconductive elements 5 are to be formed.

The recesses 3, which exhibit the same pattern as the electroconductive elements 5 having the prescribed pattern to be formed by transfer on the substrate 1, are formed in the printing plate 2.

Specifically, the printing plate 2 of the present example is a replica mold obtained by: adding a resin material such as a cycloolefin polymer (COP), polyethylene terephthalate (PET), a liquid crystal polymer (LCP), polymethyl methacrylate (PMMA), polydimethyl siloxane (PDMS), or a polyimide (PI) dropwise into a master mold produced in advance; applying pressure to the resin material using a support substrate; and curing the resin material.

The recesses 3 are formed in shapes having differing depths such that electroconductive elements 5 that serve as wiring and electroconductive elements 5 that serve as bumps can be formed by transfer at the same time.

Specifically, the recesses 3 are formed in shapes such that the electroconductive elements 5 formed by transfer on the substrate 1 have an aspect ratio of 0.5 or higher, specifically such that the aspect ratio of the electroconductive elements 5 that serve as bumps is 2-3.

Furthermore, the recesses 3 are formed as tapered (forward-tapered) recesses such that the electroconductive elements 5 attain a forward-tapered shape. Forming the recesses 3 in such a tapered shape allows an ultraviolet-ray-curable-resin-containing electroconductive paste 4 to be readily released and smoothly transferred, and also improves the yield.

The active-light-curable-resin-containing electroconductive paste 4 that forms the electroconductive elements 5 is an ultraviolet-ray-curable-resin-containing electroconductive paste 4, in which an ultraviolet-ray-curable resin that is cured by being irradiated with ultraviolet rays is incorporated into an electroconductive paste. For example, a silver (Ag) paste/nanopaste, a copper (Cu) paste/nanopaste, a gold (Au) paste/nanopaste, a platinum (Pt) paste/nanopaste, a palladium (Pd) paste/nanopaste, a ruthenium (Ru) paste/nanopaste, or a carbon (C) paste/nanopaste can be employed as the electroconductive paste serving as the electroconductive member.

The active-light-curable resin (ultraviolet-ray-curable resin) content of the ultraviolet-ray-curable-resin-containing electroconductive paste 4 is set to 70 vol % or less, specifically 20-40 vol %. Specifically, the volumetric ratio of the electroconductive paste and the ultraviolet-ray-curable resin in the ultraviolet-ray-curable-resin-containing electroconductive paste 4 used in the present example is set to 6:4-8:2.

The average grain diameter of the electroconductive material contained in the electroconductive paste in the ultraviolet-ray-curable-resin-containing electroconductive paste 4 is set to 0.1-20 μm. The average particle diameter of the electroconductive material is preferably ⅕ to ¹⁄₁₀ of the minimum line width of the electroconductive elements 5 (wiring) formed on the substrate 1. Specifically, when forming a pattern of electroconductive elements 5 for which, e.g., the minimum ratio of lines and spaces (L/S) is 5 μm/5 μm, it is permissible to use an ultraviolet-ray-curable-resin-containing electroconductive paste 4 obtained by incorporating the ultraviolet-ray-curable resin into an electroconductive paste for which the average particle diameter of the electroconductive material is set to 0.5-1.0 μm.

The specific manufacturing method according to the present example is described next.

Figure 2:
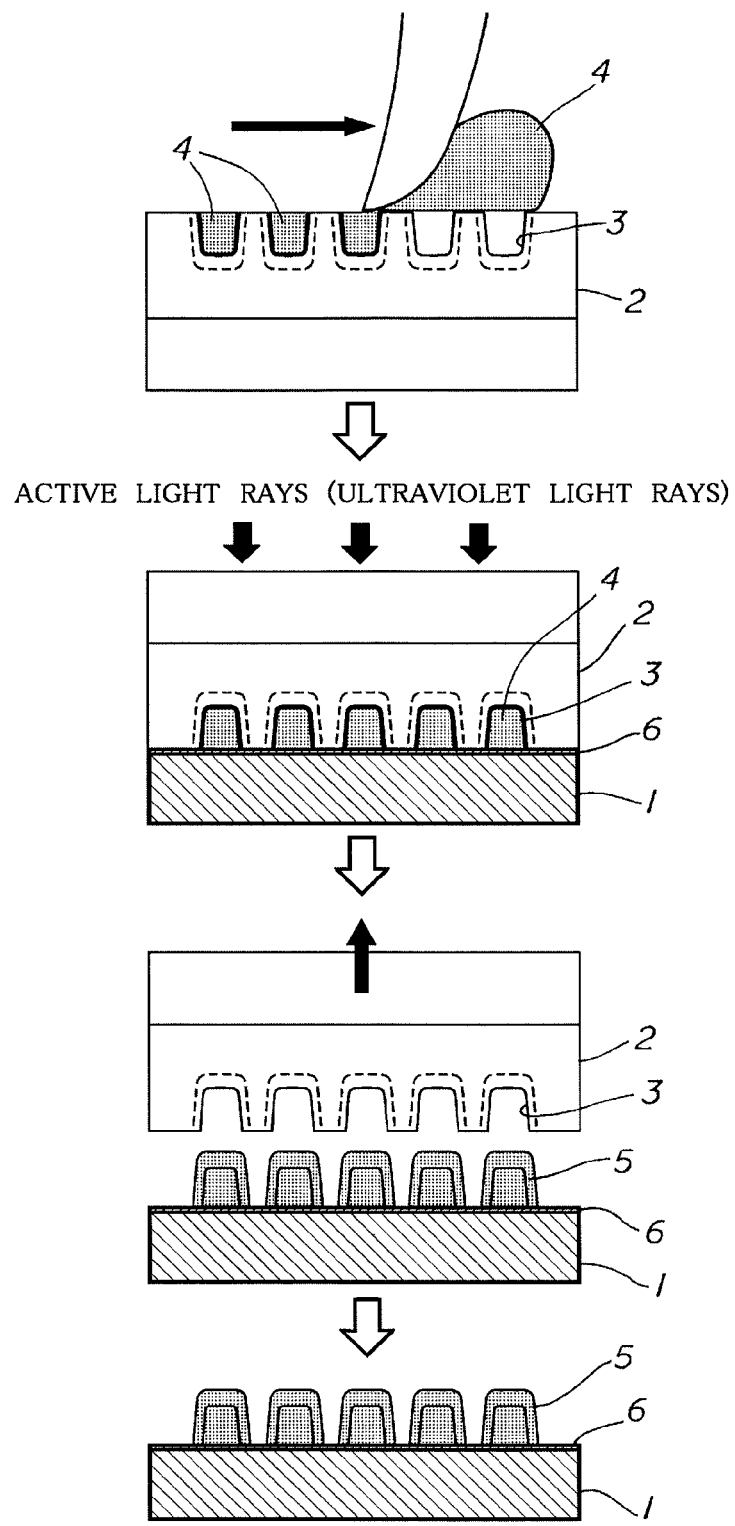
FIG. 2 is a schematic cross-sectional view of a semiconductor device during the course of manufacture in the present example.

FIG. 1 is a step flow chart of the present example. FIG. 2 is a schematic cross-sectional view of a semiconductor device during the course of manufacture in the present example.

In the present example as shown in FIG. 1, in the electroconductive paste filling process step, the recesses 3 in the printing plate 2 are first filled with the ultraviolet-ray-curable-resin-containing electroconductive paste 4. Suitable means can be used for the filling method; in the present example, a squeegee is used as filling means as shown in FIG. 2.

Next, in the printing plate superposition process step, the printing plate 2 filled with the ultraviolet-ray-curable-resin-containing electroconductive paste 4 is superposed on the substrate 1.

Specifically, after the printing plate 2 is superposed on the substrate 1, pressure is applied and the printing plate 2 is pressure-bonded to the substrate 1. The printing plate 2 thereby presses the intermediate layer 6 of the substrate 1, the intermediate layer 6 deforms, and the surface (surface exposed from the opening section of the recesses 3) of the ultraviolet-ray-curable-resin-containing electroconductive paste 4, with which the recesses 3 in the printing plate 2 are filled, uniformly achieves close contact (adhesion) with the surface of the substrate 1 with the intermediate layer 6 interposed therebetween.

Next, in the electroconductive paste curing process step, the printing plate 2 superposed on the substrate 1 is irradiated with ultraviolet rays from the printing plate 2 side, i.e., from the bottom side of the recesses 3 in the printing plate 2, curing the contact interface portion at which the ultraviolet-ray-curable-resin-containing electroconductive paste 4 with which the recesses 3 in the printing plate 2 are filled contacts the recesses 3. This improves the release properties of the active-light-curable-resin-containing electroconductive paste 4 with respect to the printing plate 2.

Because curing of the ultraviolet-ray-curable resin advances instantaneously due to the irradiation with ultraviolet rays, the processing time is much shorter than with a heat treatment. Moreover, in the present example, because only the ultraviolet-ray-curable-resin-containing electroconductive paste 4 near the contact interface for contacting the recesses 3 is to be cured, the ultraviolet ray irradiation time can be set very short.

Finally, in the electroconductive paste transfer process step, the printing plate 2 is separated from the substrate 1, the ultraviolet-ray-curable-resin-containing electroconductive paste 4 is transferred to the substrate 1, and the electroconductive elements 5 having the prescribed pattern are formed on the substrate 1.

The electroconductive paste curing process step may be carried out before the printing plate superposition process step. Specifically, a configuration may be adopted in which, after the recesses 3 in the printing plate 2 are filled with the ultraviolet-ray-curable-resin-containing electroconductive paste 4, the portion of the ultraviolet-ray-curable-resin-containing electroconductive paste 4 within the recesses 3 that is near a recess interface is first cured by irradiation with ultraviolet rays, after which the printing plate 2 is superposed on the substrate 1.

Figure 3:
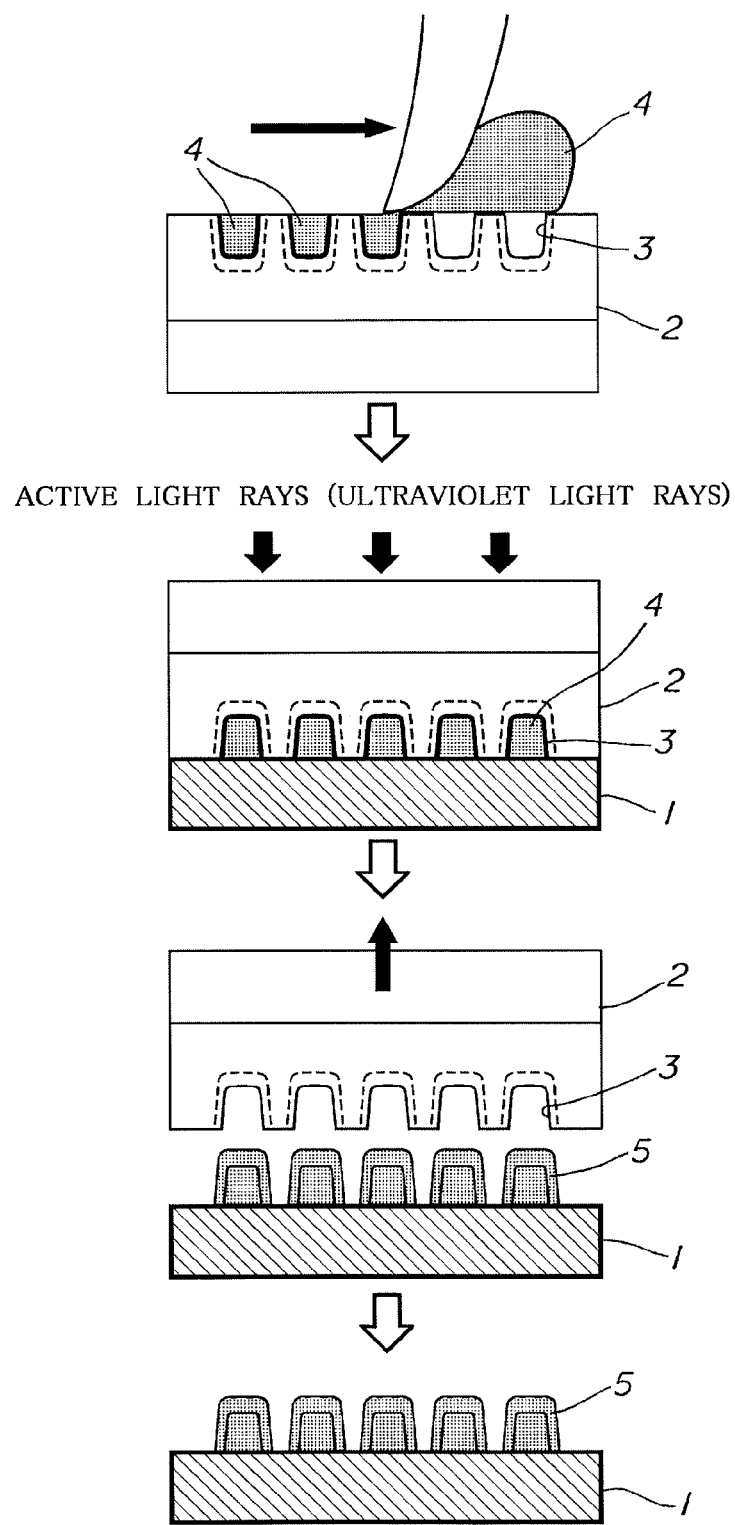
FIG. 3 is a schematic cross-sectional view of a semiconductor device during the course of manufacture in another instance of the present example (when no intermediate layer is present).

The present example was described with reference to a case in which the intermediate layer 6 is present, and although the intermediate layer 6 may be omitted from the substrate or not illustrated in the drawings, as shown in FIG. 3, the method for forming electroconductive elements into a pattern on a substrate according to the present invention can also be employed when electroconductive elements such as wiring or bumps are formed on a substrate on which wiring (a wiring layer) is already formed.

Because the present example is configured as described above, there is achieved an exceptionally practical method for forming electroconductive elements into a pattern on a substrate, the method being such that pattern deformation occurring during curing of the ultraviolet-ray-curable-resin-containing electroconductive paste 4 is suppressed when the electroconductive elements 5 having the prescribed pattern are formed by transfer on the substrate 1, complete transfer of the ultraviolet-ray-curable-resin-containing electroconductive paste 4 can be realized, the curing process can be performed in a short time, and throughput is improved.

Specifically, when a thermoset-resin-containing electroconductive paste that is cured through a heat treatment is used, there is a greater likelihood that a post-curing pattern could deform depending on the curing temperature due to a difference in the coefficients of thermal expansion between the electroconductive paste and a printing plate having recesses, or that defects could occur such that stress is generated between the electroconductive paste and the printing plate due to the deformation of the pattern and transfer cannot readily be completed. However, in the present example, the ultraviolet-ray-curable-resin-containing electroconductive paste 4 is used as the electroconductive paste for forming the electroconductive elements 5, and the ultraviolet-ray-curable-resin-containing electroconductive paste 4 is cured by being irradiated with ultraviolet rays. Therefore, pattern deformation is reduced to a greater extent than when a thermoset-resin-containing electroconductive paste is used and cured through a heat treatment, the generation of stress is also suppressed, and a 100% complete transfer can be achieved; moreover, the curing time is greatly shortened and throughput is improved.

Additionally, in the present example, there is used an ultraviolet-ray-curable-resin-containing electroconductive paste 4 in which the average particle diameter of an electroconductive material contained in an electroconductive paste is set to 0.1-20 μm. Therefore, the shape of the electroconductive elements 5 (wiring and bumps) formed on the substrate 1 becomes smoother (assumes a smooth form having few recesses and protrusions), whereby localized concentration of electrical fields between the electroconductive elements 5 is mitigated and the long-term reliability of the electroconductive elements 5 is improved. Furthermore, in the present example, because only the ultraviolet-ray-curable-resin-containing electroconductive paste 4 near the contact interface for contacting the recesses 3 in the printing plate 2 is to be cured, there are no design restrictions placed on the particle diameter of the electroconductive material.

Moreover, in the present example, there is used an ultraviolet-ray-curable-resin-containing electroconductive paste 4 in which the volume ratio of the electroconductive paste and the ultraviolet-ray-curable resin is set to 6:4 to 8:2. Therefore, the final resistance value of the electroconductive elements 5 (wiring) formed from the ultraviolet-ray-curable-resin-containing electroconductive paste 4 can be lowered.

Additionally, in the present example, the intermediate layer 6 that deforms under application of pressure is provided to the substrate 1, and the ultraviolet-ray-curable-resin-containing electroconductive paste 4 is transferred to the substrate 1 with the intermediate layer 6 interposed therebetween. Therefore, the intermediate layer 6 deforms when the printing plate 2 is superposed on the substrate 1 and pressure is applied, and the printing plate 2 uniformly adheres to a transfer surface of the substrate 1, therefore making it possible for the ultraviolet-ray-curable-resin-containing electroconductive paste 4 to be completely transferred in an even more reliable manner.

Moreover, in the present example, the recesses 3 in the printing plate 2 are formed in tapered (forward-tapered) shapes. Therefore, the electroconductive elements 5 attain a forward-tapered shape, the release properties of the ultraviolet-ray-curable-resin-containing electroconductive paste 4 with respect to the recesses 3 in the printing plate 2 during transfer are improved, separation is carried out smoothly, and the yield in the electroconductive paste transfer process step is improved.

Thus, the present example exhibits the innovative effects described above, and furthermore, there is achieved an unprecedented and innovative method for forming electroconductive elements into a pattern on a substrate, the method being such that wiring and bumps having a high aspect ratio can be formed easily and in a satisfactory manner.

The present invention is not limited to the present example; the various configuring matters can be designed in specific configurations, as appropriate.

The invention claimed is:

1. A method for forming wiring on a semiconductor device in which wiring is formed by transfer on a substrate through an imprinting method in which a replica mold created from a master mold is used, the method comprising:
   an electroconductive paste filling process step of filling recesses that are formed in the replica mold and that exhibit a prescribed pattern with an electroconductive paste containing a resin that is curable by ultraviolet rays, the ultraviolet-ray-curable-resin-containing electroconductive paste being such that an ultraviolet-ray-curable resin is incorporated into an electroconductive paste for which the average particle diameter of an electroconductive material is set to 0.1-20 μm, and is set to a range from 1/5 to 1/10 of the minimum line width of the wiring formed by transfer on the substrate, and the volumetric ratio of the electroconductive paste and the ultraviolet-ray-curable resin in the ultraviolet-ray-curable-resin-containing electroconductive paste is set to 6:4-8:2;

a replica mold superposition process step of superposing the replica mold filled with the ultraviolet-ray-curable-resin-containing electroconductive paste on the substrate; an electroconductive paste curing process step for irradiating the ultraviolet-ray-curable-resin-containing electroconductive paste with ultraviolet rays in a state in which the replica mold is superposed on the substrate and curing the ultraviolet-ray-curable-resin-containing electroconductive paste; and an electroconductive paste transfer process step of separating the replica mold from the substrate, transferring the ultraviolet-ray-curable-resin-containing electroconductive paste to the substrate, and forming wiring having the prescribed pattern, the substrate is provided with an intermediate layer made of an active light-curing resin or a heat-effect resin that deforms under pressure on the conductive part, the intermediate layer is provided to an electroconductive element formation surface at which the electroconductive elements are to be formed, the replica mold superposition process step is a step of superposing the replica mold filled with conductive paste containing the ultraviolet-ray-curable-resin-containing electroconductive paste on the intermediate layer of the substrate, and pressure-bonding the replica mold to the intermediate layer by applying pressure, the electroconductive paste curing process step involving irradiating the ultraviolet-ray-curable-resin-containing electroconductive paste with the ultraviolet rays from the bottom side of the recesses in the replica mold, and curing only a contact interface portion at which the ultraviolet-ray-curable-resin-containing electroconductive paste contacts the recesses.

2. The method for forming wiring on a semiconductor device according to claim 1, wherein the recesses are formed as tapered recesses such that the wiring attains a forward-tapered shape.

3. The method for forming wiring on a semiconductor device according to claim 1, wherein the recesses are formed in a shape such that the wiring formed by transfer on the substrate has an aspect ratio of 2-3.

4. The method for forming wiring on a semiconductor device according to claim 1, wherein the replica mold is composed of any resin material from among cycloolefin polymers, polyethylene terephthalate, liquid crystal polymers, polymethyl methacrylate, polydimethyl siloxane, and polyimides.

5. The method for forming wiring on a semiconductor device according to claim 1, wherein the electroconductive paste is any one from among silver paste, silver nanopaste, copper paste, copper nanopaste, gold paste, gold nanopaste, platinum paste, platinum nanopaste, palladium paste, palladium nanopaste, ruthenium paste, ruthenium nanopaste, carbon paste, and carbon nanopaste.

\* \* \* \* \*